(12) United States Patent
Liu et al.

(10) Patent No.: US 10,950,631 B1
(45) Date of Patent: Mar. 16, 2021

(54) SEMICONDUCTOR-ON-INSULATOR WAFER HAVING A COMPOSITE INSULATOR LAYER

(71) Applicant: Taiwan Semiconductor Manufacturing Co., Ltd., Hsin-Chu (TW)

(72) Inventors: Kuan-Liang Liu, Pingtung (TW); Yeur-Luen Tu, Taichung (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/580,259

(22) Filed: Sep. 24, 2019

(51) Int. Cl.
*H01L 27/12* (2006.01)
*H01L 21/762* (2006.01)

(52) U.S. Cl.
CPC .... *H01L 27/1203* (2013.01); *H01L 21/76256* (2013.01)

(58) Field of Classification Search
None
See application file for complete search history.

(56) References Cited

U.S. PATENT DOCUMENTS

| | | | | |
|---|---|---|---|---|
| 5,453,394 A | * | 9/1995 | Yonehara | H01L 21/76251 438/455 |
| 5,876,497 A | * | 3/1999 | Atoji | H01L 21/30604 117/85 |
| 6,103,009 A | * | 8/2000 | Atoji | H01L 21/30604 117/97 |
| 2004/0137698 A1 | * | 7/2004 | Taraschi | H01L 21/76254 438/458 |
| 2008/0248629 A1 | | 10/2008 | Yamazaki | |
| 2008/0296724 A1 | | 12/2008 | Yamazaki | |
| 2010/0096720 A1 | | 4/2010 | Ohnuma et al. | |
| 2011/0012131 A1 | | 1/2011 | Yamazaki | |
| 2016/0380101 A1 | | 12/2016 | Mason | |

OTHER PUBLICATIONS

U.S. Appl. No. 16/227,183, filed Dec. 20, 2018.
Janwaskar, Suhanshu; "SOI Silicon on Insulator Technology"; Slideshow; Dec. 9, 2017; https://www.slideshare.net/shudhanshu29/silicon-on-insulator-soi-technology?from_action=save.
"Smart Cut"; Wikipedia Article; Published May 6, 2019; https://en.wikipedia.org/wiki/Smart_cut.
U.S. Appl. No. 62/736,581, filed Sep. 26, 2018.
Non Final Office Action dated Nov. 13, 2020 in connection with U.S. Appl. No. 16/227,183.

* cited by examiner

*Primary Examiner* — Thien F Tran
(74) *Attorney, Agent, or Firm* — Eschweiler & Potashnik, LLC

(57) ABSTRACT

Various embodiments of the present disclosure are directed towards a semiconductor wafer. The semiconductor wafer comprises a handle wafer. A first oxide layer is disposed over the handle wafer. A device layer is disposed over the first oxide layer. A second oxide layer is disposed between the first oxide layer and the device layer, wherein the first oxide layer has a first etch rate for an etch process and the second oxide layer has a second etch rate for the etch process, and wherein the second etch rate is greater than the first etch rate.

20 Claims, 12 Drawing Sheets

SEMICONDUCTOR-ON-INSULATOR WAFER HAVING A COMPOSITE INSULATOR LAYER

BACKGROUND

Integrated circuits (ICs) have traditionally been formed on bulk semiconductor wafers. In recent years, semiconductor-on-insulator (SOI) wafers have emerged as an alternative to bulk semiconductor wafers. An SOI wafer comprises a handle wafer, a buried oxide layer overlying the handle wafer, and a device layer overlying the buried oxide layer. Among other things, an SOI wafer leads to reduced parasitic capacitance, reduced leakage current, reduced latch up, and improved semiconductor device performance (e.g., lower power consumption and higher switching speed).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
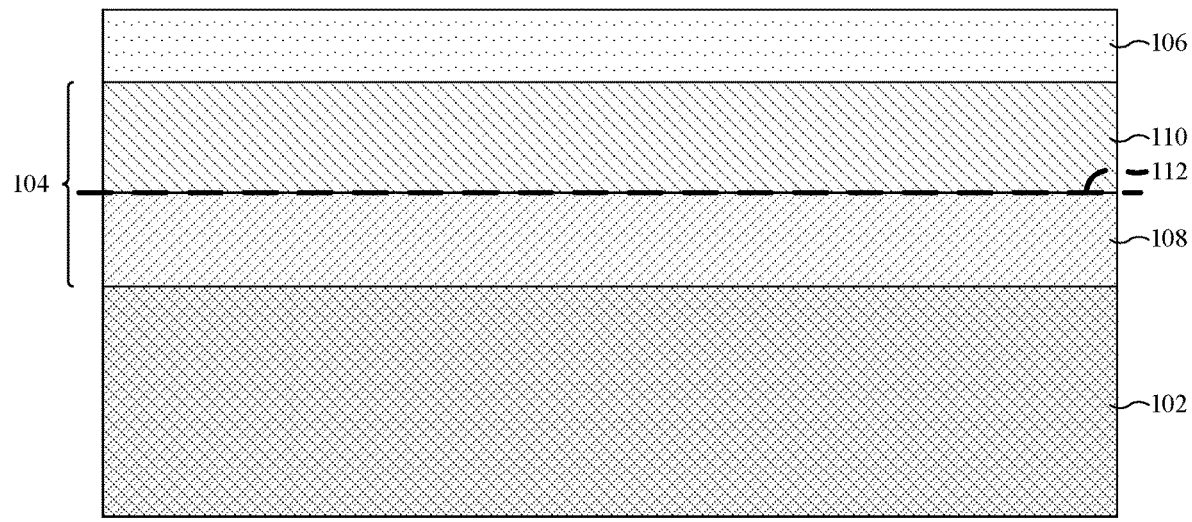
FIG. 1 illustrates a cross-sectional view of some embodiments of a semiconductor-on-insulator (SOI) wafer having a composite insulator layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some semiconductor-on-insulator (SOI) wafers comprise a handle wafer (e.g., a silicon wafer), a buried oxide layer (e.g., silicon dioxide ($SiO_2$)) overlying the handle wafer, and a device layer (e.g., a silicon layer) overlying the insulator layer. One approach for forming such an SOI wafer is a bond and etch process. One of two bond and etch process are typically utilized to form the SOI wafer.

One bond and etch process includes forming the oxide layer on the handle wafer via a thermal oxidation process. A device wafer is then bonded to the oxide layer. Thereafter, the device wafer is etched backed to form the device layer over the oxide layer. However, because the device wafer is bonded to the oxide layer, there is a bond interface between the device layer and the oxide layer. The bond interface is a source of leakage paths that negatively affect the performance of semiconductor devices (e.g., transistors) that are subsequently formed on the device layer.

Another bond and etch process includes forming the oxide layer on the device wafer via the thermal oxidation process. The handle wafer is then bonded to the oxide layer. Thereafter, the device wafer is etched backed to form the device layer over the oxide layer. However, because the oxide layer is formed on the device wafer via the thermal oxidation process, the use of an etch stop layer for the etching back of the device layer is limited. For example, the thermal oxidation process prevents the use of an epitaxial etch stop layer due to the relatively high temperature (e.g., at least 1000° C.) of the thermal oxidation process relaxing the epitaxial etch stop layer. Because the thermal oxidation process prevents the use of an epitaxial etch stop layer, the total thickness variation (TTV) of the device layer is negatively affected.

Various embodiments of the present application are directed toward a method for forming an SOI wafer. The method comprises forming an etch stop layer over a donor wafer. A device layer is formed over the etch stop layer. A first oxide layer is formed over the device layer via a chemical vapor deposition (CVD) process. A second oxide layer is formed over the handle wafer via a thermal oxidation process. The first oxide layer is then bonded to the second oxidation layer. Thereafter, the donor wafer and etch stop layer are removed to form the SOI wafer. Because the first oxide layer is formed by the CVD process, the first oxide layer may be formed on the device wafer without negatively affecting the use of the etch stop layer (e.g., due to the relatively low temperature (e.g., less than or equal to 900° C.) needed for the CVD process). Thus, the TTV of the device layer may be improved (e.g., reduced TTV). In addition, because the first oxide layer is formed on the device layer, a bond interface between the first oxide layer and the second oxide layer is disposed relatively far away from a bottom surface of the device layer. Because the bond interface is disposed relatively far away from the bottom surface of the device layer, the performance of integrated chips (e.g., dies) formed from the SOI wafer 100 may be improved due to a reduction in potential leakage paths.

FIG. 1 illustrates a cross-sectional view of some embodiments of a semiconductor-on-insulator (SOI) wafer 100 having a composite insulator layer 104.

As shown in FIG. 1, the SOI wafer 100 comprises a handle wafer 102, a composite insulator layer 104, and a device layer 106. The SOI wafer 100 may be used with, for example, complementary metal-oxide-semiconductor (CMOS) applications, embedded flash applications, CMOS image sensor applications, near infrared (NIR) applications, microelectronics applications, optoelectronics applications, micro-electro-mechanicals systems (MEMS) applications, or the like. In some embodiments, the SOI wafer 100 has a circular top layout and/or has a diameter of approximately 200, 300, or 450 millimeters (mm). In other embodiments, the SOI wafer 100 may have some other shape and/or some other dimensions.

The handle wafer 102 may be or comprise, for example, monocrystalline silicon, some other silicon material (e.g., polycrystalline silicon), some other semiconductor material (e.g., germanium (Ge)), or any combination of the foregoing. The device layer 106 overlies the handle wafer 102. The device layer 106 is configured to be processed so that semiconductor devices (e.g., transistors) may be formed on the device layer 106. The device layer 106 may be or comprise, for example, monocrystalline silicon, some other silicon material, some other semiconductor material, or any combination of the foregoing. In some embodiments, the device layer 106 may have a thickness (e.g., a distance between an upper surface and a lower surface) between 100 angstrom (Å) and 3000 Å. In further embodiments, the thickness of the device layer 106 may be 1300 Å. In yet further embodiments, the device layer 106 may be an epitaxial layer (e.g., formed by an epitaxy process).

The composite insulator layer 104 is disposed between the handle wafer 102 and the device layer 106. The composite insulator layer 104 comprises a first insulator layer 108 and a second insulator layer 110. The first insulator layer 108 contacts the second insulator layer 110 at a bond interface 112, such that material of the first insulator layer 108 is bonded to the material of the second insulator layer 110. In some embodiments, the bond interface 112 comprises dielectric-to-dielectric bonds between the material of the first insulator layer 108 and the material of the second insulator layer 110. In further embodiments, the first insulator layer 108 contacts the handle wafer 102. In yet further embodiments, the second insulator layer 110 contacts the device layer 106.

In some embodiments, the composite insulator layer 104 may have a thickness between 200 Å and 2 micrometers (um). The first insulator layer 108 may have a thickness between 100 Å and 1 um. The second insulator layer 110 may have a thickness between 100 Å and 1 um. In further embodiments, a ratio of the thickness of the second insulator layer 110 to the thickness of the first insulator layer 108 is between 0.1 and 10.

The first insulator layer 108 may be or comprise, for example, an oxide (e.g., $SiO_2$), a high-k dielectric (e.g., a dielectric material with a dielectric constant greater than 3.9), or the like. In embodiments in which the first insulator layer 108 is an oxide (e.g., $SiO_2$), the first insulator layer 108 may be referred to as a first oxide layer. In further embodiments, the first insulator layer 108 may be a thermal oxidation oxide. For example, the thermal oxidation oxide may be silicon dioxide formed by a thermal oxidation process.

The second insulator layer 110 may be or comprise, for example, an oxide (e.g., $SiO_2$), a high-k dielectric (e.g., a dielectric material with a dielectric constant greater than 3.9), or the like. In embodiments in which the second insulator layer 110 is an oxide (e.g., $SiO_2$), the second insulator layer 110 may be referred to as a second oxide layer. In further embodiments, the second insulator layer 110 may be a chemical vapor deposition (CVD) oxide. For example, the CVD oxide may be silicon dioxide formed by a CVD process, such as, plasma-enhanced CVD (PECVD), low pressure CVD (LPCVD), high-density plasma CVD (HDPCVD), or the like. Because the SOI wafer 100 comprises the composite insulator layer 104, the bond interface 112 is disposed a relatively large distance from a bottom surface of the device layer 106. Because the bond interface 112 is disposed relatively far away from the bottom surface of the device layer 106, the performance of integrated chips (e.g., dies) formed from the SOI wafer 100 may be improved due to a reduction in potential leakage paths.

Figure 2:
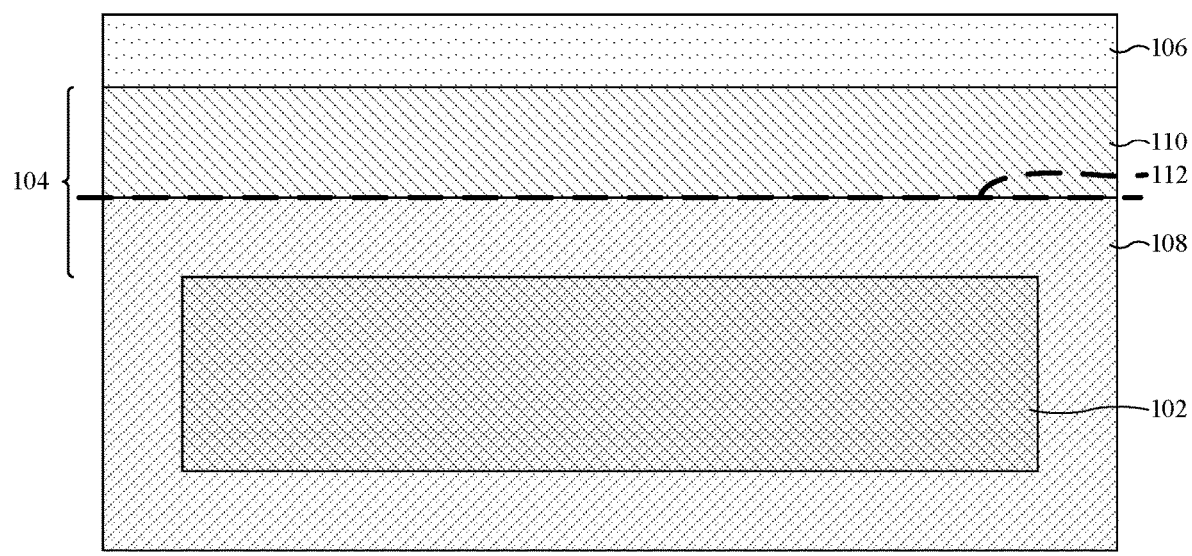
FIG. 2 illustrates a cross-sectional view of some other embodiments of the SOI wafer of FIG. 1.

FIG. 2 illustrates a cross-sectional view of some other embodiments of the SOI wafer 100 of FIG. 1.

As shown in FIG. 2, the first insulator layer 108 surrounds the handle wafer 102. In such embodiments, the first insulator layer 108 may extend continuously along an upper surface of the handle wafer 102, along a first sidewall of the handle wafer 102, along a bottom surface of the handle wafer 102, and along a second sidewall of the handle wafer 102 opposite the first sidewall. In further such embodiments, the composite insulator layer 104 comprises the second insulator layer 110 and a portion of the first insulator layer 108 disposed between the handle wafer 102 and the device layer 106.

In some embodiments, the second insulator layer 110 has a higher concentration of a predefined chemical element than the first insulator layer 108. The predefined chemical element may be, for example, hydrogen (H), carbon (C), chlorine (Cl), or the like. In further embodiments, a thermal stability of the second insulator layer 110 at a predefined temperature (e.g., between 600° C. and 1200° C.) may be the same as a thermal stability of the first insulator layer 108 at the predefined temperature. For example, the second insulator layer 110 and the first insulator layer 108 may be stable at the predefined temperature. In other embodiments, the thermal stability of the second insulator layer 110 may be different than the thermal stability of the first insulator layer 108. For example, the first insulator layer 108 may be stable at the predefined temperature and the second insulator layer 110 may densify (e.g., become denser) at the predefined temperature, or the first insulator layer 108 may be stable at the predefined temperature and the second insulator layer 110 may eject (e.g., outgas) some of the predefined chemical at the predefined temperature.

In some embodiments, a density of the second insulator layer 110 is between 2.1 gram per cubic centimeter ($g/cm^3$) and 2.3 $g/cm^3$. In further embodiments, the density of the second insulator layer 110 and a density of the first insulator layer 108 may be the same. For example, both the density of the first insulator layer 108 and the density of the second insulator layer 110 may be 2.2 $g/cm^3$. In other embodiments, the density of the second insulator layer 110 may be different than the density of the first insulator layer 108. For example, the density of the second insulator layer 110 may be greater than the density of the first insulator layer 108 (e.g., 2.3 $g/cm^3$ and 2.2 $g/cm^3$, respectively), or the density of the second insulator layer 110 may be less than the density of the first insulator layer 108 (e.g., 2.1 $g/cm^3$ and 2.2 $g/cm^3$, respectively).

In some embodiments, an intrinsic stress of the second insulator layer 110 is between 3 megapascal (MPa) compressive and 3 MPa tensile. In further embodiments, the intrinsic stress of the second insulator layer 110 may be 3 MPa tensile, 1 MPa compressive, or 3 MPa compressive. In yet further embodiments, the intrinsic stress of the second insulator layer 110 may be the same as an intrinsic stress of the first insulator layer 108. For example, both the intrinsic stress of the first insulator layer 108 and the intrinsic stress of the second insulator layer 110 may be 3 MPa compressive. In other embodiments, the intrinsic stress of the second insulator layer 110 may be different than the intrinsic stress of the first insulator layer 108. For example, the intrinsic stress of the first insulator layer 108 may be 3 MPa compressive and the intrinsic stress of the second insulator layer may be 2 MPa compressive, 1 MPa compressive, 1 MPa tensile, 2 MPa tensile, 3 MPa tensile, or some other intrinsic stress value that is different than the intrinsic stress of the first insulator layer 108.

In some embodiments, a dielectric strength of the second insulator layer 110 is less than 11 megavolt per centimeter (MV/cm). In further embodiments, a dielectric strength of the first insulator layer 108 is greater than or equal to 11 MV/cm. In further embodiments, the dielectric strength of the second insulator layer 110 is between 5 MV/cm and 10 MV/cm. In yet further embodiments, the dielectric strength of the second insulator layer 110 may be 5 MV/cm, 8 MV/cm, or 10 MV/cm. The dielectric strength of the second insulator layer 110 may be different than a dielectric strength of the first insulator layer 108. For example, the dielectric strength of the first insulator layer 108 may be 11 MV/cm and the dielectric strength of the second insulator layer 110 may be 5 MV/cm, 8 MV/cm, or 10 MV/cm.

In some embodiments, the first insulator layer 108 has a first etch rate for a predefined etching process, and the second insulator layer 110 has a second etch rate for the predefined etching process that is different than the first etch rate. In further embodiments, the first etch rate is less than the second etch rate. The first etch rate may be less than or equal to 25 angstroms per minute (Å/min). The second etch rate may be between 400 Å/min and 30 Å/min. In yet further embodiments, the second etch rate is 400 Å/min, 60 Å/min, or 30 Å/min. In further embodiments, the predefined etching process is a hydrofluoric (HF) etching process (e.g., HF acid etching process). In yet further embodiments, the HF etching process utilizes a HF acid solution having a ratio of water ($H_2O$) to HF acid of 100:1.

In some embodiments, the first insulator layer 108 is a conformal layer that conforms to the contours of the handle wafer 102. In further embodiments, the second insulator layer 110 is a conformal layer that conforms to the contours of the bottom surface of the device layer 106. In other embodiments, the second insulator layer 110 is a non-conformal layer. In yet further embodiments, the first insulator layer 108 is a conformal layer and the second insulator layer 110 is a conformal layer. In other embodiments, the second insulator layer 110 is a non-conformal layer and the first insulator layer 108 is a conformal layer.

Figure 3:
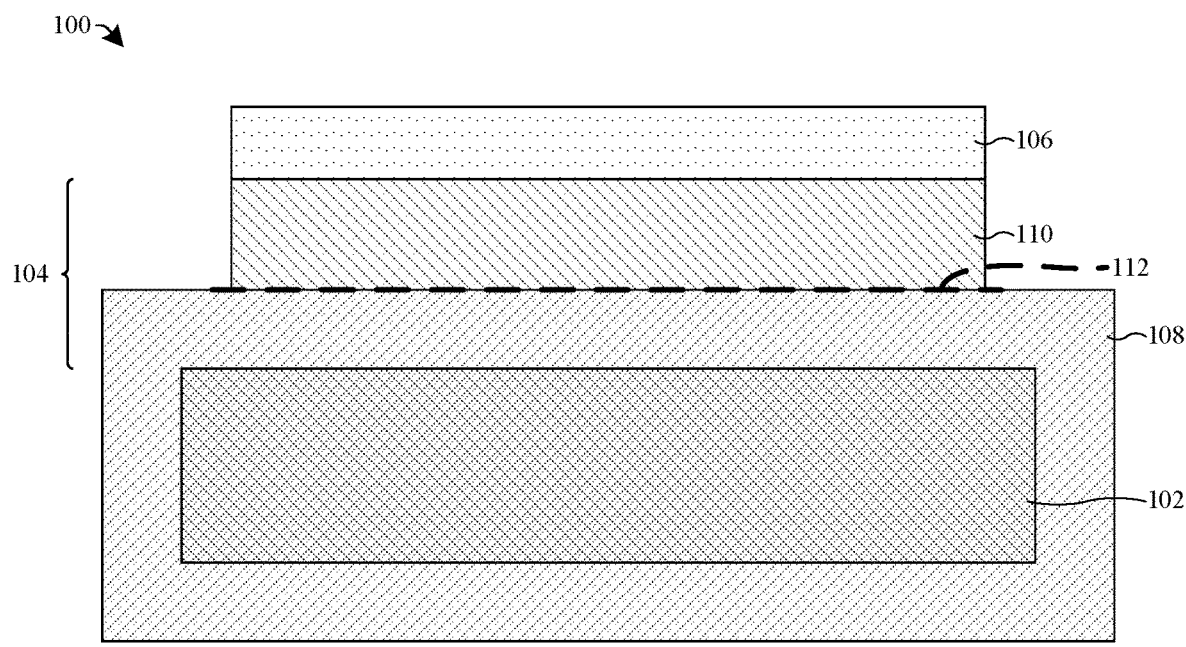
FIG. 3 illustrates a cross-sectional view of some other embodiments of the SOI wafer of FIG. 1.

FIG. 3 illustrates a cross-sectional view of some other embodiments of the SOI wafer 100 of FIG. 1.

In some embodiments, outermost sidewalls of the second insulator layer 110 are disposed between outermost sidewalls of the first insulator layer 108, such that an edge region of the SOI wafer 100 has a step-like profile. The outermost sidewalls of the second insulator layer 110 may be disposed between the outermost sidewalls of the handle wafer 102. In further embodiments, outermost sidewalls of the device layer 106 are disposed between the outermost sidewalls of the first insulator layer 108. The outermost sidewalls of the device layer 106 may be disposed between the outermost sidewalls of the handle wafer 102. In further embodiments, the outermost sidewalls of the device layer 106 are substantially aligned with the outermost sidewalls of the second insulator layer 110. In yet further embodiments, the outermost sidewall of the device layer 106 and/or the outermost sidewalls of the second insulator layer 110 may extend vertically at an angle that is substantially perpendicular to an upper surface of the first insulator layer 108. In other embodiments, the outermost sidewall of the device layer 106 and/or the outermost sidewalls of the second insulator layer 110 may be angled (e.g., angled inward or outward).

In some embodiments, the outermost sidewalls of the first insulator layer 108 may be disposed between the outermost sidewalls of the device layer 106 and/or the outermost sidewalls of the handle wafer 102. In further embodiments, the outermost sidewalls of the second insulator layer 110 may be disposed between the outermost sidewalls of the device layer 106 and/or the outermost sidewalls of the handle wafer 102. In yet further embodiments, the outermost sidewalls of the second insulator layer 110 may be disposed between the outermost sidewalls of the first insulator layer 108.

Figure 4:
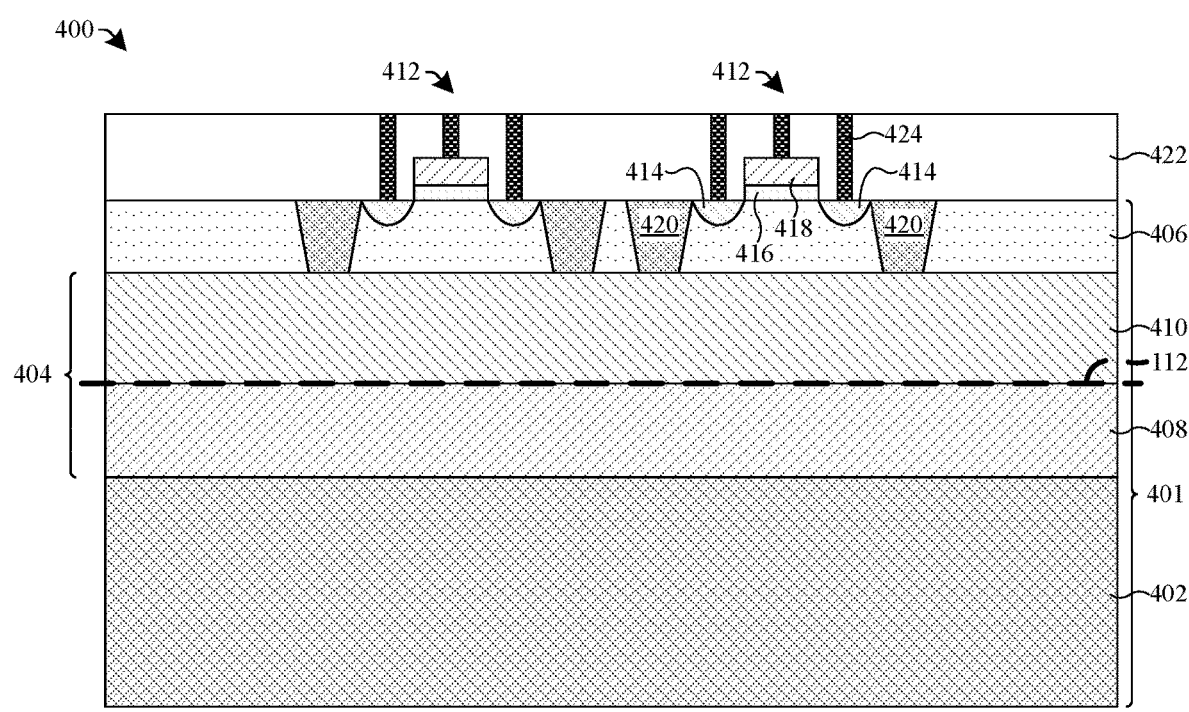
FIG. 4 illustrates a cross-sectional view of some embodiments of an integrated chip (IC) comprising a semiconductor-on-insulator (SOI) substrate having a composite insulator structure.

FIG. 4 illustrates a cross-sectional view of some embodiments of an integrated chip (IC) 400 comprising a semiconductor-on-insulator (SOI) substrate 401 having a composite insulator structure 404.

As shown in FIG. 4, the IC 400 comprises an SOI substrate 401. The SOI substrate 401 is a portion of the SOI wafer 100. The SOI substrate 401 comprises a handle substrate 402, a composite insulator structure 404, and a device substrate 406. The handle substrate 402 is a portion of the handle wafer 102. The device substrate 406 is a portion of the device layer 106. The composite insulator structure 404 is a portion of the composite insulator layer 104.

The composite insulator structure 404 comprises a first insulator structure 408 and a second insulator structure 410. The first insulator structure 408 is a portion of the first insulator layer 108. The second insulator structure 410 is a first portion of the second insulator layer 110. The first insulator structure 408 contacts the second insulator structure 410 at the bond interface 112, such that material of the first insulator structure 408 is bonded to the material of the second insulator structure 410.

One or more semiconductor devices 412 are disposed on/over the device substrate 406. The one or more semiconductor devices 412 may be or comprise, for example, metal-oxide-semiconductor (MOS) field-effect transistors (FETs), some other MOS devices, or some other semiconductor devices. In some embodiments, each of the one or more semiconductor devices 412 comprises a pair of source/drain regions 414, a gate dielectric 416, and a gate electrode 418. In further embodiments, one or more isolation structures 420 (e.g., shallow trench isolation (STI) structures) are disposed in the device substrate 406. The one or more isolation structures 420 may laterally surround the one or more semiconductor devices 412. In yet further embodiments, the one or more isolation structures 420 may extend through the device substrate 406 to contact the second insulator structure 410. In other embodiments, the one or more isolation structures 420 may be vertically spaced from the second insulator structure 410.

An interlayer dielectric (ILD) layer 422 is disposed over the device substrate 406 and the one or more semiconductor devices 412. The ILD layer 422 may comprise, for example, an oxide (e.g., $SiO_2$), a low-k dielectric (e.g., a dielectric material with a dielectric constant less than about 3.9), or the like. A plurality of conductive contacts 424 (e.g., tungsten contacts) are disposed in the ILD layer 422. In some embodiments, the plurality of conductive contacts 424 extend through the ILD layer 422 to the source/drain regions 414 and/or the gate electrode 418 of each of the one or more semiconductor devices 412.

Although not shown, additional dielectric layers and conductive features may be disposed over the ILD layer 422 and the conductive contacts 424. For example, one or more additional ILD layers, conductive wires (e.g., copper wires), conductive vias (e.g., copper vias), and/or passivation layers may be disposed over the ILD layer 422. In such embodiments, the ILD layers may be collectively referred to as an ILD structure, and the conductive features may collectively be referred to as an interconnect structure (e.g., copper interconnect structure).

In some embodiments, outermost sidewalls of the ILD layer 422 are substantially aligned with outermost sidewalls of the device substrate 406. The outermost sidewalls of the device substrate 406 may be substantially aligned with outermost sidewalls of the second insulator structure 410. In further embodiments, the outermost sidewalls of the second insulator structure 410 are substantially aligned with outermost sidewalls of the first insulator structure 408. The outermost sidewalls of the first insulator structure 408 may be substantially aligned with outermost sidewalls of the handle substrate 402.

In some embodiments, the outermost sidewalls of the first insulator structure 408 may be disposed between the outermost sidewalls of the device substrate 406 and/or the outermost sidewalls of the handle substrate 402. In further embodiments, the outermost sidewalls of the second insulator structure 410 may be disposed between the outermost sidewalls of the device substrate 406 and/or the outermost sidewalls of the handle substrate 402. In yet further embodiments, the outermost sidewalls of the second insulator structure 410 may be disposed between the outermost sidewalls of the first insulator structure 408.

Figure 5:
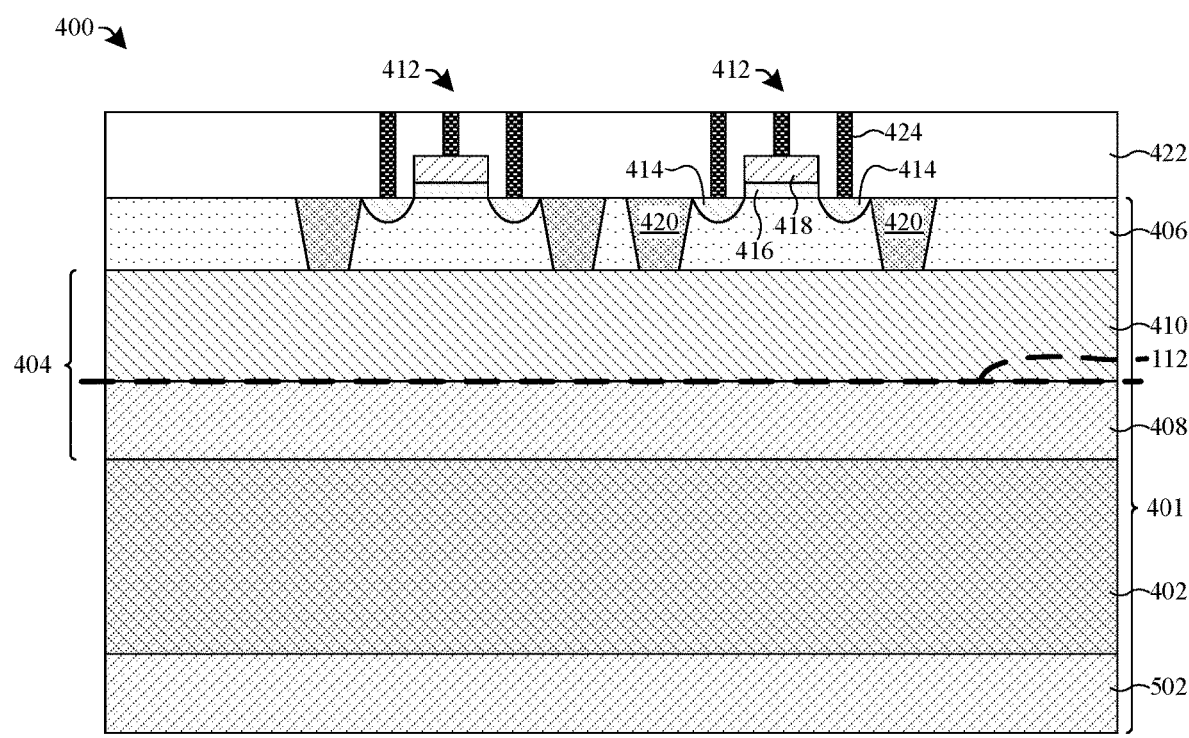
FIG. 5 illustrates a cross-sectional view of some other embodiments of the IC of FIG. 4.

FIG. 5 illustrates a cross-sectional view of some other embodiments of the IC 400 of FIG. 4.

As shown in FIG. 5, the IC 400 may comprise a third insulator structure 502. In some embodiments, the third insulator structure 502 is a second portion of the first insulator layer 108. The third insulator structure 502 may have a same chemical composition as the first insulator structure 408. In further embodiments, the third insulator structure 502 has a third etch rate for the predefined etching process that is the same as the first etch rate. The third insulator structure 502 and the first insulator structure 408 may have a same thermal stability, density, intrinsic stress, and/or dielectric strength. In further embodiments, the third insulator structure 502 conforms to the contours of a bottom surface of the handle substrate 402. In yet further embodiments, outermost sidewalls of the third insulator structure 502 may be substantially aligned with the outermost sidewalls of the handle substrate 402.

FIGS. 6-16 illustrate a series of cross-sectional views of some embodiments for forming a semiconductor-on-insulator (SOI) wafer 100 having a composite insulator layer 104 and singulating individual integrated chips (ICs) from the SOI wafer 100.

Figure 6:
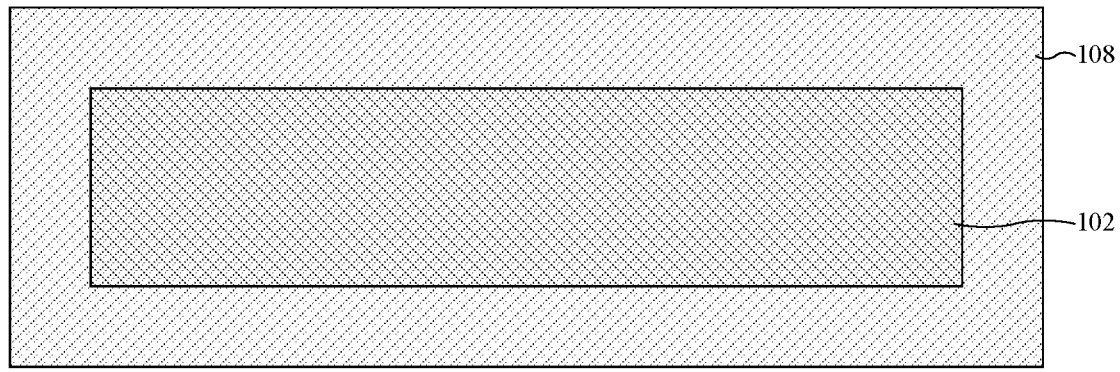
FIGS. 6-16 illustrate a series of cross-sectional views of some embodiments for forming a semiconductor-on-insulator (SOI) wafer having a composite insulator layer and singulating individual integrated chips (ICs) from the SOI wafer.

As shown in FIG. 6, a first insulator layer 108 is formed on a handle wafer 102. In some embodiments, the first insulator layer 108 is formed on an upper surface of the handle wafer 102. In further embodiments, the first insulator layer 108 is formed as a continuous layer on the upper surface of the handle wafer 102, a first sidewall of the handle wafer 102, a bottom surface of the handle wafer 102, and a second sidewall of the handle wafer 102 opposite the first sidewall. In yet further embodiments, the first insulator layer 108 is formed as a conformal layer.

In some embodiments, a process for forming the first insulator layer 108 comprises growing the first insulator layer 108 via a thermal oxidation process. In further embodiments, the thermal oxidation process comprises oxidizing the handle wafer 102 in a processing chamber. In yet further embodiments, the thermal oxidation process comprises loading the handle wafer into the processing chamber, heating the handle wafer to a first processing temperature, and flowing a processing fluid into the processing chamber. The first processing temperature may be greater than or equal to 800° C. In further embodiments, the first processing temperature may be greater than or equal to 1000° C. The processing fluid may comprise, for example, oxygen (O), hydrogen (H), a combination of the foregoing, or some other processing fluid suitable for oxidizing the handle wafer 102.

In some embodiments, a planarization process (e.g., chemical-mechanical polishing (CMP)) may be performed on the handle wafer 102 and/or the first insulator layer 108 to reduce a thickness of the handle wafer 102. The thickness of the handle wafer 102 may be reduced to less than or equal to 2 um. In further embodiments, the thickness of the handle wafer is reduced to 1.9 um.

Figure 7:
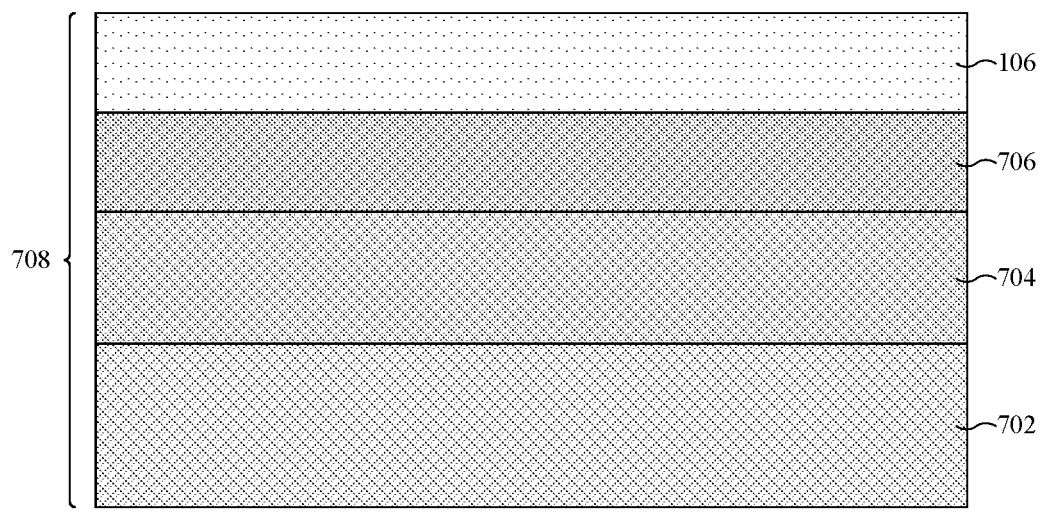

As shown in FIG. 7, a processing layer 704 is formed over a donor wafer 702. In some embodiments, the processing layer 704 is formed on the donor wafer 702. The donor wafer 702 may comprise any type of semiconductor body (e.g., monocrystalline silicon/CMOS bulk, silicon-germanium (SiGe), silicon on insulator (SOI), etc.). In some embodiments, the donor wafer 702 is doped with first doping type dopants (e.g., p-type dopants). In further embodiments, the donor wafer 702 has a first doping concentration of the first doping type dopants.

In some embodiments, the processing layer 704 is a semiconductor (e.g., silicon, germanium, etc.). In such embodiments, the processing layer 704 may be referred to as a semiconductor layer. In further embodiments, the processing layer 704 is silicon (e.g., monocrystalline silicon, polycrystalline silicon, etc.). The processing layer 704 may be doped with the first doping type dopants. The processing layer 704 may have a second doping concentration of the first doping type dopants that is less than the first doping concentration.

In some embodiments, the processing layer 704 is an epitaxial layer (e.g., formed by an epitaxy process). In further embodiments, the processing layer 704 may have a thickness less than or equal to 2 um. In other embodiments, the processing layer 704 may have a thickness greater than 2 um. In further embodiments, the thickness of the processing layer 704 may be 1.8 um. In yet further embodiments, a process for forming the processing layer 704 comprises depositing or growing the processing layer 704 by, for example, a CVD process, an epitaxy process, or the like.

Also shown in FIG. 7, an etch stop layer 706 is formed over the processing layer 704. In some embodiments, the etch stop layer 706 is formed on the processing layer 704. The etch stop layer 706 may comprise, for example, silicon (Si), germanium (Ge), oxygen (O), boron (B), arsenic (As), or the like. In some embodiments, the etch stop layer 706 is an epitaxial etch stop layer (e.g., formed by an epitaxy process).

In some embodiments, the etch stop layer 706 may have a thickness less than or equal to 20 nanometers (nm). In other embodiments, the thickness of the etch stop layer 706 may be greater than 20 nm. In further embodiments, the thickness of the etch stop layer 706 may be 15 nm. In further embodiments, a process for forming the etch stop layer 706 comprises depositing or growing the processing layer 704 by, for example, a CVD process, an epitaxy process, or the like.

Also shown in FIG. 7, a device layer 106 is formed over the etch stop layer 706. In some embodiments, the device layer 106 is formed on the etch stop layer 706. The device layer 106 may be an epitaxial layer (e.g., formed by an epitaxy process). In further embodiments, the device layer 106, the etch stop layer 706, and the processing layer 704 are each an epitaxial layer. In yet further embodiments, a process for forming the device layer 106 comprises depositing or growing the device layer 106 by, for example, a CVD process, an epitaxy process, or the like.

In some embodiments, the etch stop layer 706 may be an implant doped etch stop layer. In such embodiments, the etch stop layer 706 may comprise the first doping type dopants or second doping type dopants (e.g., n-type dopants). In further such embodiments, the etch stop layer 706 may be disposed in the donor wafer 702, the processing layer 704, and/or the device layer 106. In yet further embodiments, the donor wafer 702, the processing layer 704, the etch stop layer 706, and the device layer 106 may be collectively referred to as a workpiece 708.

Figure 8:
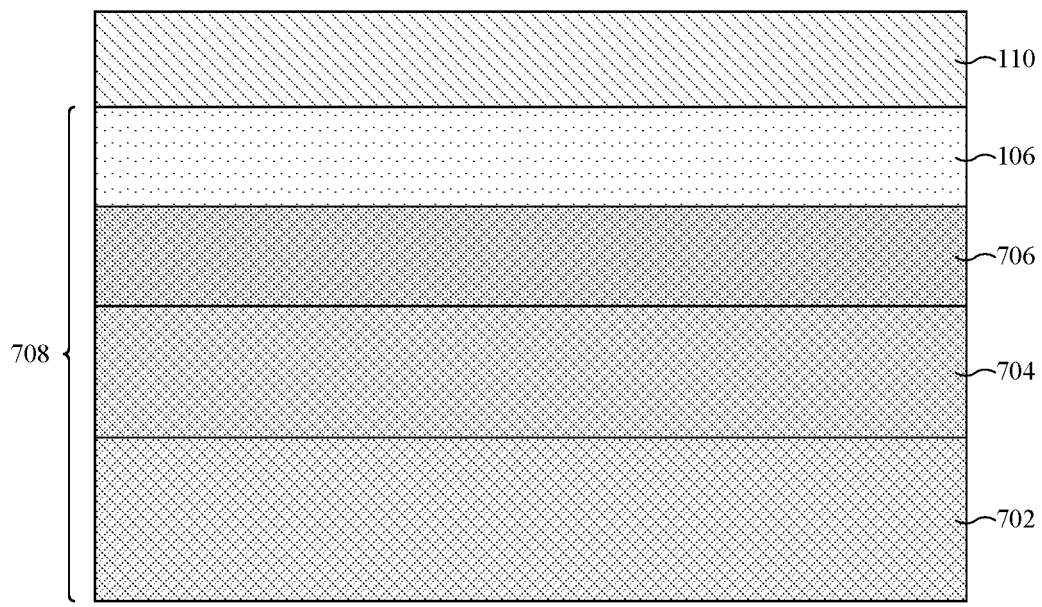

As shown in FIG. 8, a second insulator layer 110 is formed over the device layer 106. In some embodiments, the second insulator layer 110 is formed on the device layer 106. In further embodiments, the second insulator layer 110 is formed as a conformal layer. In other embodiments, the second insulator layer 110 is formed as a non-conformal layer. In yet further embodiments, a process for forming the second insulator layer 110 comprises depositing the second insulator layer 110 via a CVD process. For example, the second insulator layer 110 may be deposited by PECVD, LPCVD, HDPCVD, or the like.

In some embodiments, the second insulator layer 110 may be formed by a first PECVD. In further embodiments, the first PECVD process comprises forming the second insulator layer 110 over the device layer 106 in a processing chamber. In further embodiments, the first PECVD process comprises loading the workpiece 708 into the processing chamber, heating the workpiece 708 to a second processing temperature, and flowing one or more processing fluids into a processing chamber. The second processing temperature may be less than 800° C. In further embodiments, the second processing temperature is less than or equal to 200° C. The one or more processing fluids may be or comprise, for example, silane ($SiH_4$), oxygen (O), or the like. In yet further embodiments, the first PECVD process may form the second insulator layer 110 as a non-conformal layer.

In some embodiments, the second insulator layer 110 may be formed by a first LPCVD. In further embodiments, the first LPCVD process comprises forming the second insulator layer 110 over the device layer 106 in a processing chamber. In further embodiments, the first LPCVD process comprises loading the workpiece 708 into the processing chamber, heating the workpiece 708 to a third processing temperature, and flowing one or more processing fluids into the processing chamber. The third processing temperature may be less than 800° C. In further embodiments, the third processing temperature is less than or equal to 450° C. The one or more processing fluids may be or comprise, for example, $SiH_4$, oxygen (O), or the like. In yet further embodiments, the first LPCVD process may form the second insulator layer 110 as a non-conformal layer.

In some embodiments, the second insulator layer 110 may be formed by a second LPCVD. In further embodiments, the second LPCVD process comprises forming the second insulator layer 110 over the device layer 106 in a processing chamber. In further embodiments, the second LPCVD process comprises loading the workpiece 708 into the processing chamber, heating the workpiece 708 to a fourth processing temperature, and flowing one or more processing fluids into the processing chamber. The fourth processing temperature may be less than 800° C. In further embodiments, the fourth processing temperature may be less than or equal to 700° C. The one or more processing fluids may be or comprise, for example, carbon (C), oxygen (O), hydrogen (H), tetraethyl orthosilicate (TEOS), or the like. In yet further embodiments, the second LPCVD process may form the second insulator layer 110 as a conformal layer.

In some embodiments, the second insulator layer 110 may be formed by a third LPCVD. In further embodiments, the third LPCVD process comprises forming the second insulator layer 110 over the device layer 106 in a processing chamber. In further embodiments, the third LPCVD process comprises loading the workpiece 708 into the processing chamber, heating the workpiece 708 to a fifth processing temperature, and flowing one or more processing fluids into the processing chamber. The fifth processing temperature may be less than 1000° C. In further embodiments, the fifth processing temperature may be less than or equal to 900° C. The one or more processing fluids may be or comprise, for example, oxygen (O), nitrogen (N), hydrogen (H), chlorine (Cl), dichlorosilane ($SiCl_2H_2$), or the like. In yet further embodiments, the third LPCVD process may form the second insulator layer 110 as a conformal layer. While several examples of CVD processes for forming the second insulator layer 110 are provided above, it will be appreciated that, in some embodiments, other CVD process having their own specific operating conditions (e.g., processing temperatures, processing fluids, etc.) may be utilized to form the second insulator layer 110.

Figure 9:
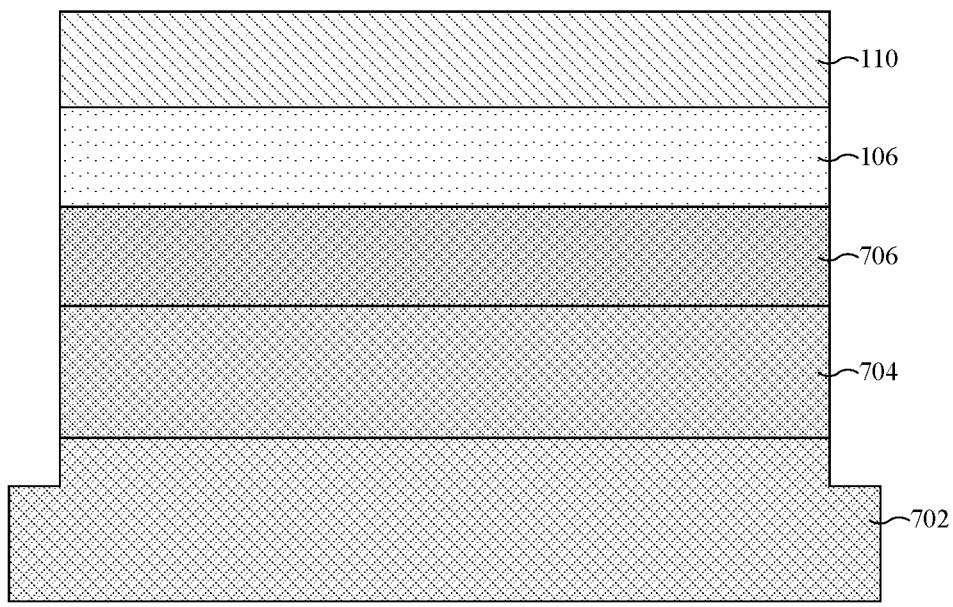

As shown in FIG. 9, in some embodiments, the second insulator layer 110, the device layer 106, the etch stop layer 706, the processing layer 704, and the donor wafer 702 are patterned to remove edge regions of the second insulator layer 110, the device layer 106, the etch stop layer 706, the processing layer 704, and the donor wafer 702, respectively. In some embodiments, the patterning comprises forming a patterned masking layer (not shown) (e.g., negative/positive photoresist) on the device layer 106. Thereafter, the second insulator layer 110, the device layer 106, the etch stop layer 706, the processing layer 704, and the donor wafer 702 are exposed to an etchant (e.g., wet/dry etchant) to remove unmasked portions of the second insulator layer 110, the device layer 106, the etch stop layer 706, the processing layer 704, and the donor wafer 702. Subsequently, in some embodiments, the patterned masking layer is stripped away. It will be appreciated that, in some embodiments, multiple patterned masking layers and/or multiple etchants may be utilized to remove the edge regions of the second insulator layer 110, the device layer 106, the etch stop layer 706, the processing layer 704, and the donor wafer 702.

Figure 10:
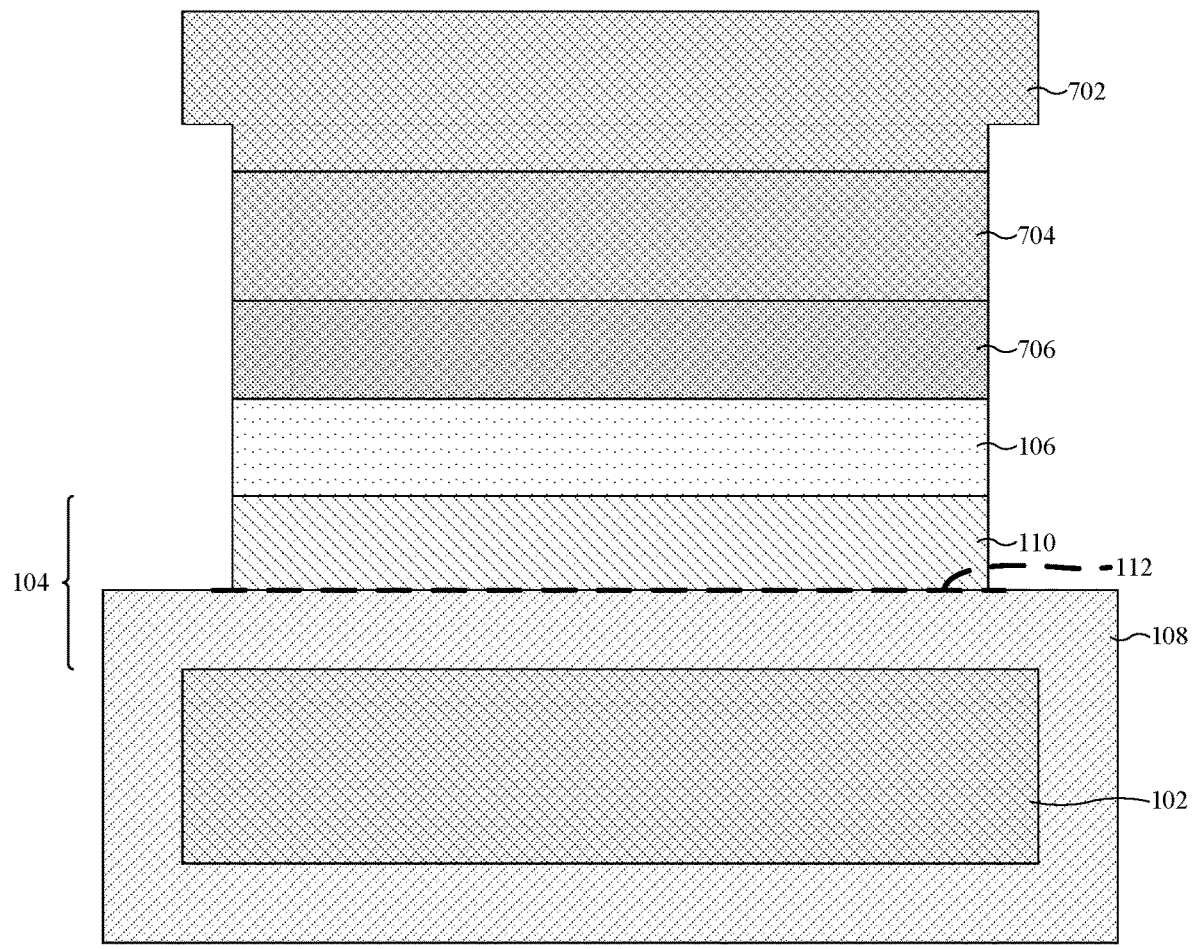

As shown in FIG. 10, the second insulator layer 110 is bonded to the first insulator layer 108, thereby forming a composite insulator layer 104 comprising the first insulator layer 108 and the second insulator layer 110. In some embodiments, the second insulator layer 110 is bonded to the first insulator layer 108 by, for example, direct bonding, vacuum bonding, or the like. By bonding the second insulator layer 110 to the first insulator layer 108, a bond interface 112 is formed between the second insulator layer 110 and the first insulator layer 108. In further embodiments, the bond interface 112 comprises dielectric-to-dielectric bonds between a material of the first insulator layer 108 and a material of the second insulator layer 110.

Figure 11:
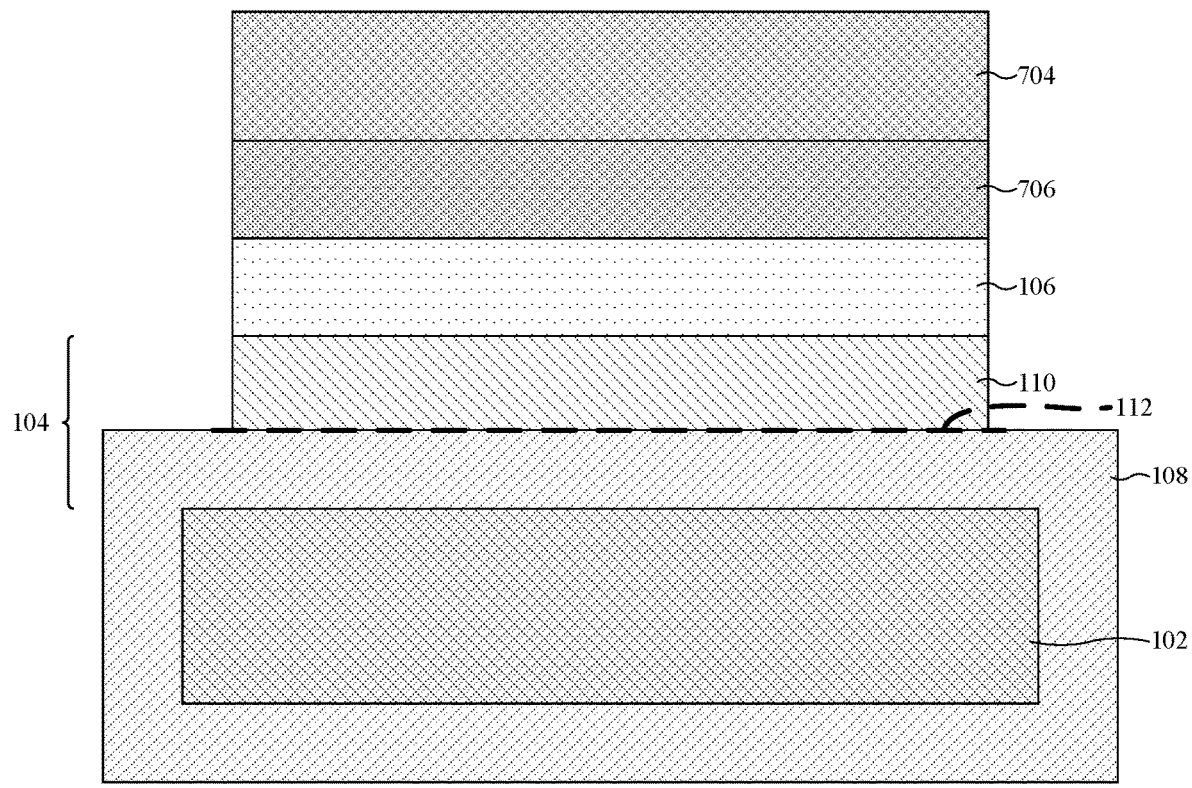

As shown in FIG. 11, the donor wafer 702 (see, e.g., FIG. 7) is removed from the processing layer 704. In some embodiments, a process for removing the donor wafer 702 from the processing layer 704 comprises a first etching process that comprises exposing the donor wafer 702 to a first etchant (e.g., wet/dry etchant). In further embodiments, the process for removing the donor wafer 702 from the processing layer 704 comprises performing a grinding process on the donor wafer. A planarization process (e.g., CMP) may then be performed on the donor wafer 702. Thereafter, the first etching process may be performed on the donor wafer 702. In yet further embodiments, the first etchant may comprise, for example, hydrogen (H), fluorine (F), oxygen (O), carbon (C), nitrogen (N), or the like.

Figure 12:
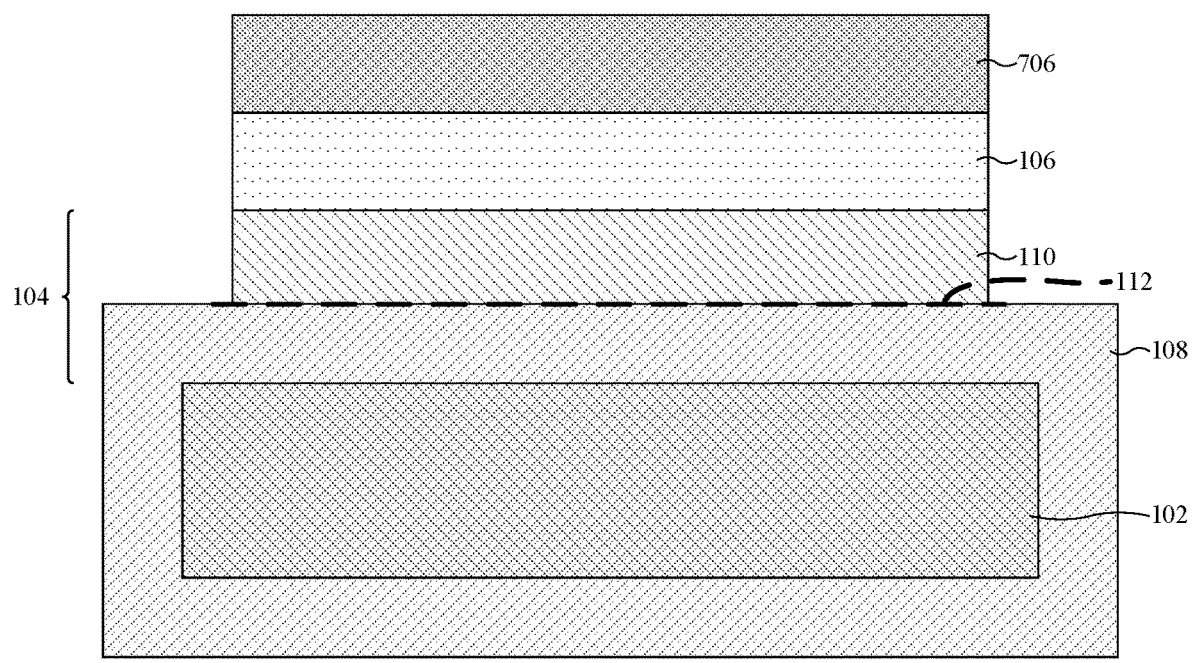

As shown in FIG. 12, the processing layer 704 (see, e.g., FIG. 7) is removed from the etch stop layer 706. In some embodiments, a process for removing the processing layer 704 from the etch stop layer 706 comprises a second etching process that comprises exposing the processing layer 704 to a second etchant (e.g., wet/dry etchant). In further embodiments, the process for removing the processing layer 704 from the etch stop layer 706 comprises performing a planarization process (e.g., CMP) on the processing layer 704. Thereafter, the second etching process may be performed on the processing layer 704. The etch stop layer 706 is less selective to the second etchant than the processing layer 704, thereby terminating the second etching process at the etch stop layer 706. In further embodiments, the second etchant may comprise, for example, hydrogen (H), oxygen (O), carbon (C), nitrogen (N), or the like. In yet further embodiments, the second etchant may be different than the first etchant.

Figure 13:
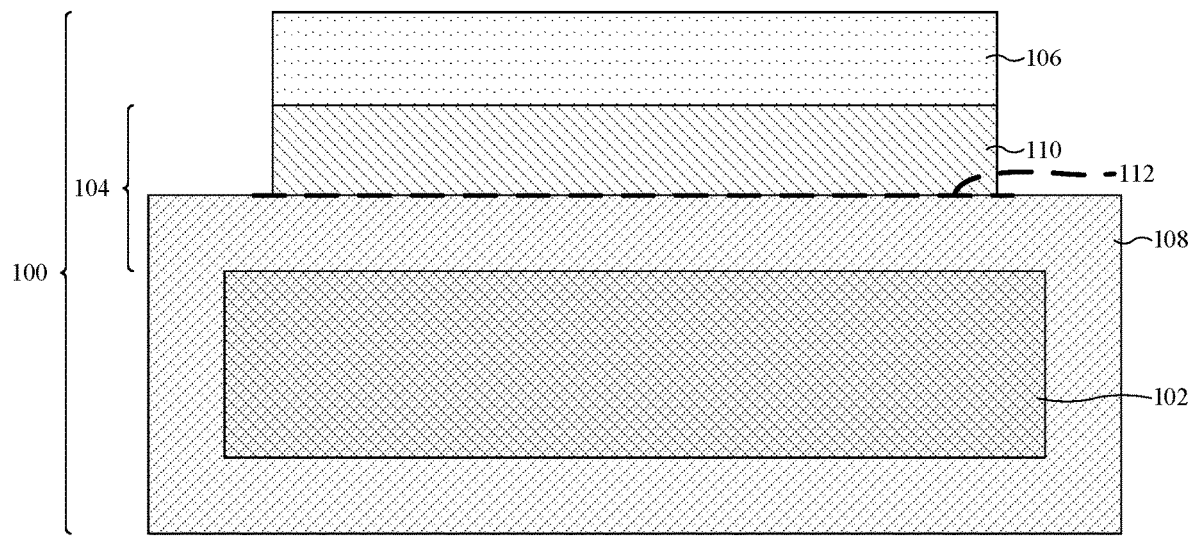

As shown in FIG. 13, the etch stop layer 706 (see, e.g., FIG. 7) is removed from the device layer 106. In some embodiments, a process for removing the etch stop layer 706 from the device layer 106 comprises a third etching process that comprises exposing the etch stop layer to a third etchant (e.g., wet/dry etchant). In further embodiments, the third etchant may comprise, for example, hydrogen (H), fluorine (F), oxygen (O), carbon (C), nitrogen (N), or the like. The third etchant is different than the second etchant. In yet further embodiments, after the etch stop layer is removed, formation of the SOI wafer 100 (see, e.g., FIG. 1) is complete.

Because the second insulator layer 110 is formed by a CVD process, the processing temperature to form the second insulator layer 110 may be relatively low (e.g., less than or equal to 900° C., 800° C., 700° C., 450° C., or 200° C.). Because the processing temperature to form the second insulator layer 110 is relatively low, the second insulator layer 110 may be formed on the device layer 106 without negatively affecting the etch stop layer 706. Thus, the total thickness variation (TTV) of the device layer 106 may be improved (e.g., a reduction in TTV).

For example, if the etch stop layer 706 is an epitaxial layer, the relatively low temperature may not undesirably relax the etch stop layer 706. Because the relatively low temperature may not undesirably relax the etch stop layer 706, after the second etching process, a TTV of the etch stop layer 706 may be improved. In addition, if the etch stop layer 706 is an implant doped etch stop layer, the relatively low temperature may widen the doping profile of the etch stop layer 706. Because the relatively low temperature may widen the doping profile of the etch stop layer 706, after the second etching process, a TTV of the etch stop layer 706 may be improved. Because the TTV of the etch stop layer 706 may be improved after the second etching process, the TTV of the device layer 106 may be improved (e.g., due to the improved TTV of the etch stop layer translating into an improved TTV of the device layer after the third etching process).

In some embodiments, after the etch stop layer 706 is removed from the device layer 106, the device layer 106 may be thinned down. In some embodiments, the device layer may be thinned down to a thickness between 100 Å and 3000 Å. In further embodiments, the device layer 106 may be thinned down by a thinning process, for example, an anneal process, a baking process, a planarization process (e.g., CMP), some other thinning process, or a combination of the foregoing.

Figure 14:
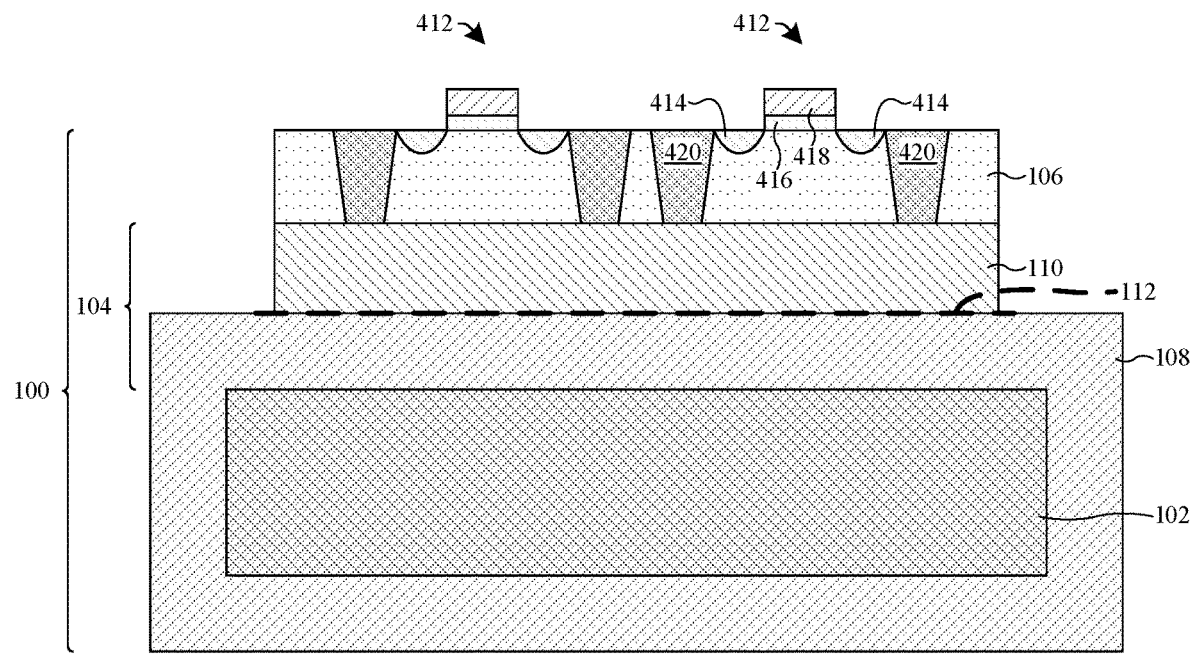

As shown in FIG. 14, one or more isolation structures 420 (e.g., shallow trench isolation (STI) structures) are formed in the device layer 106. In some embodiments, a process for forming the one or more isolation structures 420 comprises forming a patterned masking layer (not shown) on the device layer 106. The device layer 106 is then exposed to an etchant to remove unmasked portions of the device layer 106, thereby forming one or more trenches in the device layer 106. Subsequently, in some embodiments, the patterned masking layer is stripped away. Thereafter, a dielectric layer (not shown) is deposited or grown on the device layer 106 and in the one or more trenches. A planarization process (e.g., CMP) is then performed on the dielectric layer, thereby forming the one or more isolation structures 420. In further embodiments, the one or more isolation structures 420 may be formed extending through the device layer 106 to the second insulator layer 110. In other embodiments, the one or more isolation structures 420 may be formed in the device layer 106 so that the one or more isolation structures 420 are vertically spaced from the second insulator layer 110.

Also shown in FIG. 14, one or more semiconductor devices 412 are formed on/over the device layer 106. In some embodiments, a process for forming the one or more semiconductor devices 412 comprises depositing or growing a gate dielectric layer (not shown) (e.g., $SiO_2$) on the device layer 106. A gate electrode layer (not shown) (e.g., polysilicon) is then deposited on the gate dielectric layer. A patterned masking layer (not shown) is then formed on the gate electrode layer. The gate electrode layer and the gate dielectric layer are then exposed to an etchant to remove unmasked portions of gate electrode layer and the gate dielectric layer, thereby forming a gate electrode 418 and a gate dielectric 416 for each of the one or more semiconductor devices 412. Subsequently, in some embodiments, the patterned masking layer is stripped away. Thereafter, source/drain regions 414 are formed in the device layer 106. In some embodiments, the source/drain regions 414 may be formed by an ion implantation process (e.g., a self-aligned ion implantation process). In further embodiments, the above layers and/or structures may be deposited or grown by, for example, CVD, physical vapor deposition (PVD), atomic layer deposition (ALD), thermal oxidation, sputtering, some other deposition or growth process, or a combination of the foregoing.

Figure 15:
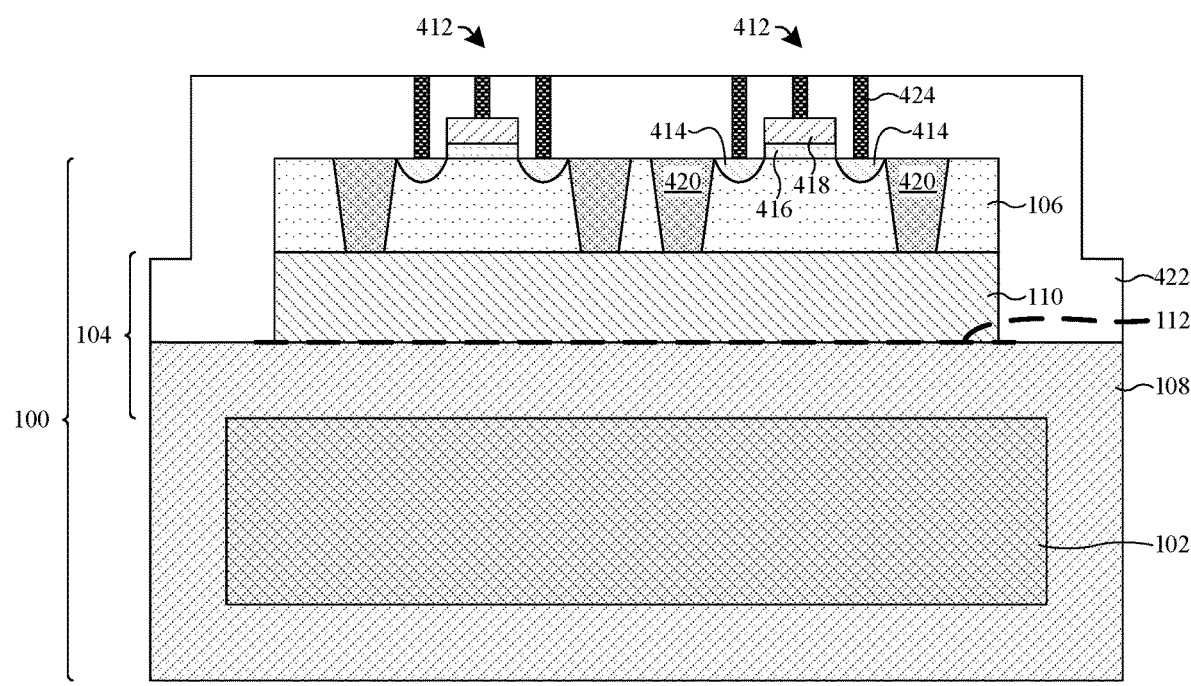

As shown in FIG. 15, an interlayer dielectric (ILD) layer 422 is formed over the one or more semiconductor devices 412, the device layer 106, and the first insulator layer 108. In some embodiments, the ILD layer 422 is formed contacting the device layer 106, the one or more isolation structures 420, the second insulator layer 110, and the first insulator layer 108. In further embodiments, a process for forming the ILD layer 422 comprises depositing the ILD layer 422 by, for example, CVD, PVD, sputtering, or the like. In yet further embodiments, a planarization process (e.g., CMP) may be performed on the ILD layer 422 to planarize an upper surface of the ILD layer 422.

Also shown in FIG. 15, a plurality of conductive contacts 424 are formed extending through the ILD layer 422 to the source/drain regions 414 and/or the gate electrode 418 of each of the one or more semiconductor devices 412. In some embodiments, a process for forming the plurality of conductive contacts 424 comprises forming a patterned masking layer on the ILD layer 422. Thereafter, the ILD layer 422 is exposed to an etchant to remove unmasked portions of ILD layer 422, thereby forming a plurality of conductive contact openings in the ILD layer 422. Subsequently, in some embodiments, the patterned masking layer is stripped away. A conductive material (e.g., tungsten) is then deposited on the ILD layer 422 and in the plurality of conductive contact openings. The conductive material may be deposited by, for example, CVD, PVD, ALD, sputtering, electrochemical plating, electroless plating, or the like. Subsequently, a planarization process (e.g., CMP) is performed on the conductive material, thereby forming the plurality of conductive contacts 424. Although not shown, additional dielectric layers and conductive features may be subsequently formed over the ILD layer 422. For example, one or more additional ILD layers, conductive wires (e.g., copper wires), conductive vias (e.g., copper vias), and/or passivation layers may be formed over the ILD layer 422.

Figure 16:
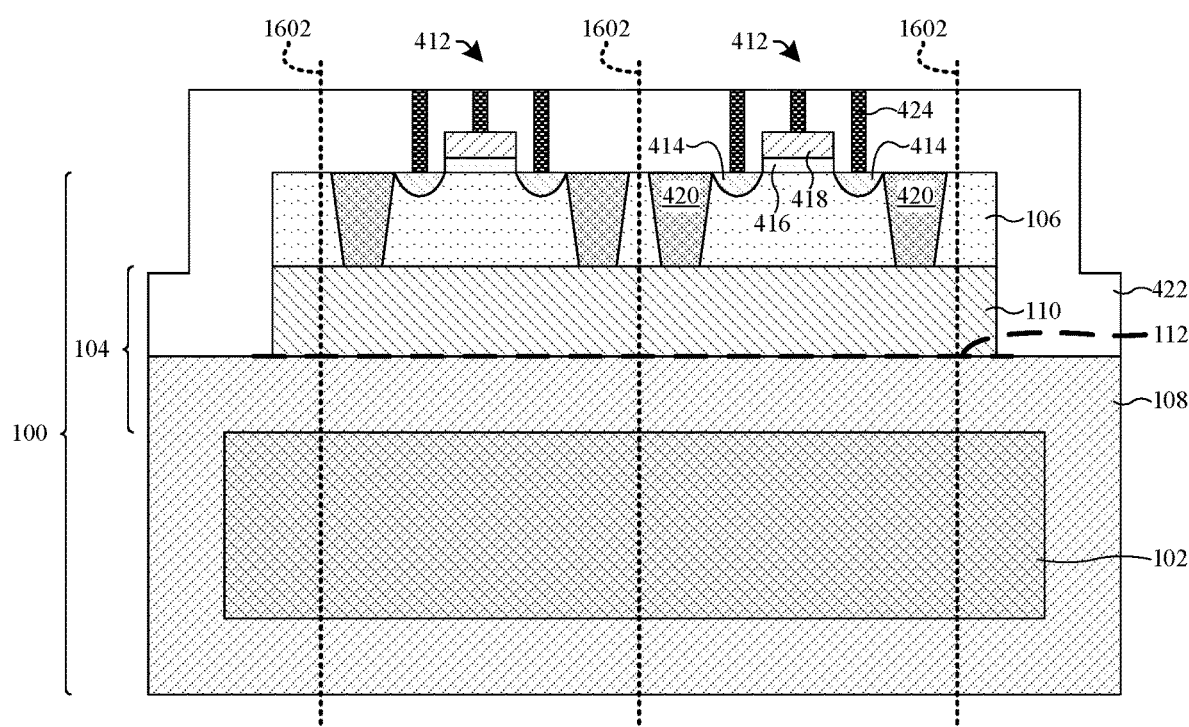

As shown in FIG. 16, a wafer dicing process is performed to singulate individual ICs from the SOI wafer 100. In some embodiments, the wafer dicing process comprises performing a series of cuts into the SOI wafer 100 and the ILD layer 422 to form a plurality of scribe lines 1602. Subsequently, a mechanical force is applied to the SOI wafer 100 to singulate the individual ICs from the SOI wafer 100. In further embodiments, the cuts may be performed by, for example, mechanical sawing, laser cutting, or the like. It will be appreciated that, in some embodiments, the IC 400 (see, e.g., FIG. 4 or 5) may be one of the individual ICs sigulated from the SOI wafer 100.

Figure 17:
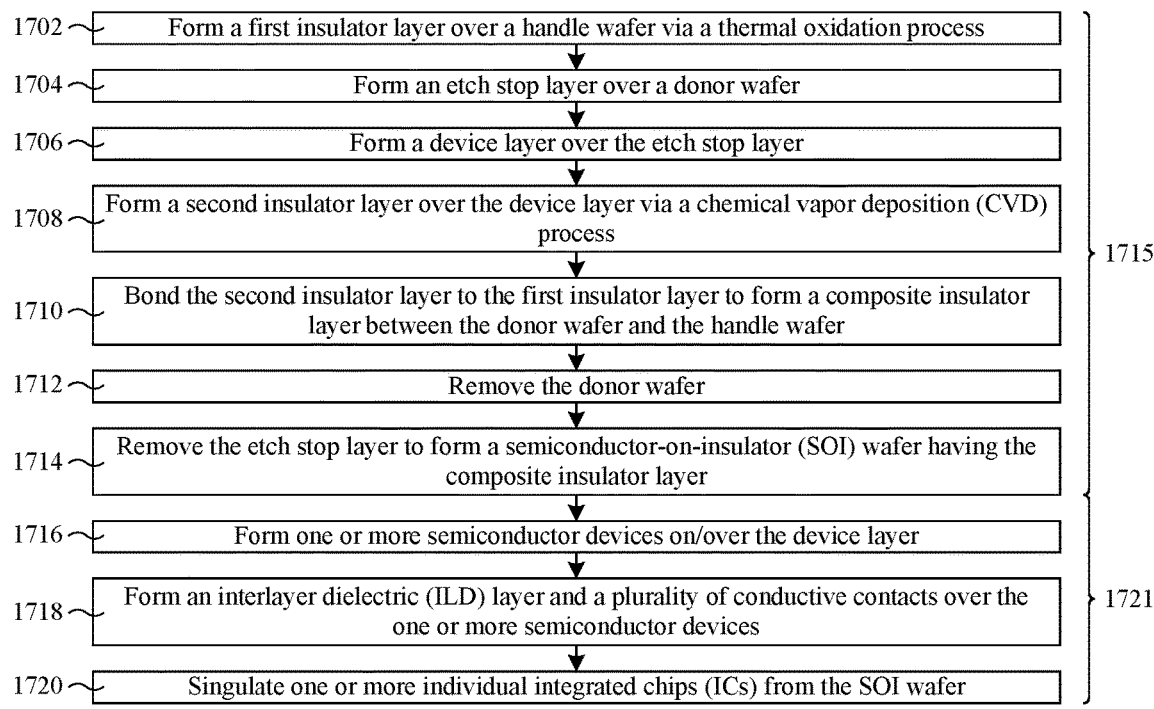
FIG. 17 illustrates a flowchart of some embodiments of a method for forming a semiconductor-on-insulator (SOI) wafer having a composite insulator layer and singulating individual integrated chips (ICs) from the SOI wafer.

FIG. 17 illustrates a flowchart of some embodiments of a method for forming a semiconductor-on-insulator (SOI) wafer having a composite insulator layer and singulating individual integrated chips (ICs) from the SOI wafer. While the flowchart 1700 of FIG. 17 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1702, a first insulator layer is formed over a handle wafer via a thermal oxidation process. FIG. 6 illustrates a cross-sectional view of some embodiments corresponding to act 1702.

At act 1704, an etch stop layer is formed over a donor wafer. FIG. 7 illustrates a cross-sectional view of some embodiments corresponding to act 1704.

At act 1706, a device layer is formed over the etch stop layer. FIG. 7 illustrates a cross-sectional view of some embodiments corresponding to act 1706.

At act 1708, a second insulator layer is formed over the device layer via a chemical vapor deposition (CVD) process. FIG. 8 illustrates a cross-sectional view of some embodiments corresponding to act 1708.

At act 1710, the second insulator layer is bonded to the first insulator layer to form a composite insulator layer between the donor wafer and the handle wafer. FIGS. 9-10 illustrate a series of cross-sectional views of some embodiments corresponding to act 1710.

At act 1712, the donor wafer is removed. FIG. 11 illustrates a cross-sectional view of some embodiments corresponding to act 1712.

At act 1714, the etch stop layer is removed to form a semiconductor-on-insulator (SOI) wafer having the composite insulator layer. FIGS. 12-13 illustrate a series of cross-sectional views of some embodiments corresponding to act 1714. In some embodiments, a method 1715 for forming the SOI wafer comprises acts 1702, 1704, 1706, 1708, 1710, 1712, and 1714.

At act 1716, one or more semiconductor devices are formed on/over the device layer. FIG. 14 illustrates a cross-sectional view of some embodiments corresponding to act 1716.

At act 1718, an interlayer dielectric (ILD) layer and a plurality of conductive contacts are formed over the one or more semiconductor devices. FIG. 15 illustrates a cross-sectional view of some embodiments corresponding to act 1718.

At act 1720, one or more individual integrated chips (ICs) are singulated from the SOI wafer. FIG. 16 illustrates a cross-sectional view of some embodiments corresponding to act 1720. In some embodiments, a method 1721 for forming an integrated chip (IC) comprising a semiconductor-on-insulator (SOI) substrate having a composite insulator structure comprises acts 1716, 1718, and 1720.

In some embodiments, the present application provides a semiconductor wafer. The semiconductor wafer comprises a handle wafer. A first oxide layer is disposed over the handle wafer. A device layer is disposed over the first oxide layer. A second oxide layer is disposed between the first oxide layer and the device layer, wherein the first oxide layer has a first etch rate for an etch process and the second oxide layer has a second etch rate for the etch process, and wherein the second etch rate is greater than the first etch rate.

In some embodiments, the present application provides an integrated chip (IC). The IC comprises a semiconductor wafer. The semiconductor wafer comprises: a handle substrate; a device substrate disposed over the handle substrate; and a composite oxide structure disposed between the handle substrate and the device substrate, wherein the composite oxide structure comprises a first oxide structure and a second oxide structure, wherein the first oxide structure has a first etch rate for a hydrofluoric etch and the second oxide structure has a second etch rate for the hydrofluoric etch, and wherein the second etch rate is greater than the first etch rate. A semiconductor device is disposed on the device substrate. An interlayer dielectric layer (ILD) is disposed over the semiconductor device.

In some embodiments, the present application provides a method for forming a semiconductor wafer. The method comprises forming a first oxide layer on a handle wafer via a thermal oxidation process. An etch stop layer is formed over a donor wafer. A device layer is formed over the etch stop layer. A second oxide layer is formed on the device layer via a chemical vapor deposition (CVD) process. The first oxide layer is bonded to the second oxide layer, wherein both the first oxide layer and the second oxide layer are disposed between the device layer and the handle wafer. After the first oxide layer is bonded to the second oxide layer, the donor wafer is removed via a first etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor wafer, the method comprising:
   forming a first oxide layer on a handle wafer via a thermal oxidation process;
   forming an etch stop layer over a donor wafer;
   forming a device layer over the etch stop layer;
   forming a second oxide layer on the device layer via a chemical vapor deposition (CVD) process;
   bonding the first oxide layer to the second oxide layer, wherein both the first oxide layer and the second oxide layer are disposed between the device layer and the handle wafer; and
   after the first oxide layer is bonded to the second oxide layer, removing the donor wafer via a first etching process.

2. The method of claim 1, further comprising:
   after the first oxide layer is bonded to the second oxide layer, removing the etch stop layer via a second etching process.

3. The method of claim 2, wherein:
   the etch stop layer is formed via an epitaxy process.

4. The method of claim 1, further comprising:
   before the etch stop layer is formed over the donor wafer, forming a processing layer over the donor wafer, wherein the etch stop layer is formed over the processing layer.

5. The method of claim 4, wherein:
   the processing layer is formed by a first epitaxy process;
   the etch stop layer is formed by a second epitaxy process; and
   the device layer is formed by a third epitaxy process.

6. The method of claim 1, further comprising:
   before the first oxide layer is bonded to the second oxide layer, removing edge regions of the second oxide layer, edge regions of the device layer, and edge regions of the etch stop layer, wherein when the first oxide layer is bonded to the second oxide layer, outermost sidewalls of the second oxide layer, outermost sidewalls of the device layer, and outermost sidewalls of the etch stop layer are disposed between outermost sidewalls of the first oxide layer.

7. The method of claim 1, wherein:
   the first oxide layer has a first dielectric strength; and
   the second oxide layer has a second dielectric strength that is less than the first dielectric strength.

8. The method of claim 1, wherein:
   the first oxide layer has a first density; and
   the second oxide layer has a second density different than the first density.

9. The method of claim 8, wherein the second density is less than the first density.

10. The method of claim 8, wherein the second density is greater than the first density.

11. The method of claim 1, wherein:
    the first oxide layer has a first thickness;
    the second oxide layer has a second thickness; and
    a sum of the first thickness and the second thickness is less than or equal to about 2 micrometers (um).

12. The method of claim 11, wherein a ratio of the second thickness to the first thickness is between about 0.1 and about 10.

13. The method of claim 11, wherein the second thickness is between about 100 angstroms (Å) and about 1 um.

14. A method for forming a semiconductor-on-insulator (SOI) wafer, the method comprising:
    growing a first insulator layer on a first semiconductor wafer via an oxidation process;
    forming an etch stop layer over a second semiconductor wafer;
    forming a semiconductor layer over the etch stop layer and the second semiconductor wafer;
    depositing a second insulator layer over the semiconductor layer and the etch stop layer via a deposition process;
    bonding the first insulator layer to the second insulator layer, such that the first insulator layer, the second insulator layer, and the semiconductor layer are disposed between the first semiconductor wafer and the second semiconductor wafer; and
    after the first insulator layer is bonded to the second insulator layer, removing the second semiconductor wafer and the etch stop layer to expose the semiconductor layer.

15. The method of claim 14, wherein the first insulator layer is grown on an upper surface of the first semiconductor wafer, a bottom surface of the first semiconductor wafer, and opposite sidewalls of the first semiconductor wafer.

16. The method of claim 14, wherein the oxidation process comprises heating the first semiconductor wafer to about 1000° C.

17. The method of claim 16, wherein the deposition process comprises heating the second semiconductor wafer to a processing temperature that is less than about 800° C.

18. A method for forming a semiconductor-on-insulator (SOI) wafer, the method comprising:
    growing a first insulator layer on a handle wafer via an oxidation process;
    growing a processing layer on a donor wafer via a first epitaxial process;
    growing an etch stop layer on the processing layer via a second epitaxial process;
    growing a device layer on the etch stop layer via a third epitaxial process;
    depositing a second insulator layer over the device layer, the processing layer, and the etch stop layer via a chemical vapor deposition (CVD) process;
    removing edge regions of the second insulator layer, the etch stop layer, the processing layer, and the device layer;
    after the edge regions of the second insulator layer, the etch stop layer, the processing layer, and the device layer are removed, bonding the second insulator layer to the first insulator layer, such that outermost sidewalls of the second insulator layer, outermost sidewalls of the etch stop layer, outermost sidewalls of the processing layer, and outermost sidewalls of the device layer are disposed between outermost sidewalls of the first insulator layer; and after the second insulator layer is bonded to the first insulator layer, removing the donor wafer, the processing layer, and the etch stop layer to expose the device layer.

19. The method of claim 18, wherein:

the oxidation process comprises heating the handle wafer to about 1000° C.; and the CVD process comprises heating the donor wafer to a processing temperature that is less than about 200° C.

20. The method of claim 18, wherein:

the first insulator layer comprises oxygen; and the second insulator layer comprises oxygen.

* * * * *